US007126175B2

(12) United States Patent
Inoue et al.

(10) Patent No.: US 7,126,175 B2
(45) Date of Patent: Oct. 24, 2006

(54) SEMICONDUCTOR DEVICE INCLUDING LIGHT SHIELED STRUCTURES

(75) Inventors: Susumu Inoue, Atsugi (JP); Yo Takeda, Shonai (JP); Yutaka Maruo, Sakata (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/288,458

(22) Filed: Nov. 29, 2005

(65) Prior Publication Data

US 2006/0138496 A1    Jun. 29, 2006

(30) Foreign Application Priority Data

Dec. 27, 2004   (JP)   ............... 2004-376703

(51) Int. Cl.
  *H01L 31/062* (2006.01)
  *H01L 31/113* (2006.01)
(52) U.S. Cl. ...................... 257/294; 257/435
(58) Field of Classification Search ............... 257/294, 257/435, 293
  See application file for complete search history.

(56) References Cited

U.S. PATENT DOCUMENTS

2005/0205901 A1*   9/2005   Suzuki ................. 257/291

2006/0060899 A1*   3/2006   Hong et al. ............. 257/294

FOREIGN PATENT DOCUMENTS

JP    2003-124363    4/2003

* cited by examiner

*Primary Examiner*—Phat X. Cao
(74) *Attorney, Agent, or Firm*—Harness, Dickey & Pierce, P.L.C.

(57) ABSTRACT

A semiconductor device comprising: a first light shielded region including a first semiconductor element, the first light shielded region being defined by a first light shielding wall provided in the periphery thereof; a second light shielded region including a second semiconductor element, the second light shielded region being defined by a second light shielding wall provided in the periphery thereof and being provided in a position adjacent to the first light shielded region; a first opening provided in the first light shielding wall; a second opening provided in the second light shielding wall and positioned facing to the first opening; a first wiring layer coupled with the first semiconductor element and brought out to the outside of the first light shielded region from the first opening; a second wiring layer coupled with the second semiconductor element and brought out to the outside of the second light shielded region from the second opening; and a light shielding film provided at least above a region sandwiched between the first light shielded region and the second light shielded region.

9 Claims, 4 Drawing Sheets

(A)

(B)

(C)

SEMICONDUCTOR DEVICE INCLUDING LIGHT SHIELED STRUCTURES

The entire disclosure of Japanese Patent Application No. 2004-376703, filed Dec. 27, 2004 is expressly incorporated by reference herein.

BACKGROUND

1. Technical Field

The present invention relates to semiconductor devices including semiconductor elements whose characteristics may vary by receiving light.

2. Related Art

Semiconductor elements whose characteristics may vary by receiving light include MOS transistors, nonvolatile memories having a floating gate electrode and the like. Such semiconductor elements may receive light when mounted particularly with a COG mounting method, such as a bear chip, and as a result, in case of MOS transistors the on/off characteristics may vary, and also in case of nonvolatile memories electrons injected into the floating gate electrode may escape therefrom. In order to prevent such characteristic variations of the semiconductor elements, a light shielding layer for preventing light from being radiated is provided above regions in which such devices are provided.

JP-A-2003-124363 is an example of related art.

As one of the light shielding techniques, a technique disclosed in the example can be listed. In the related art example, there are provided an effective region of a memory cell array and a light shielding region as to enclose the outside thereof, and the light shielding region includes a via layer and a contact layer provided in different levels. Thus, this is a technique for arranging these via layer and contact layer in a staggered form to thereby suppress the intrusion of light from the lateral and diagonal directions.

However, in order to reduce the intrusion of light from the lateral and diagonal directions, even if the light shielding region is provided as to enclose the effective region of the memory cell array, there is a need or the like to extend the wirings such as signal lines to the outside of the light shielding region from the effective region of the memory cell array. For this reason, the periphery of the effective region of the memory cell array may not be enclosed completely with the via layer and the contact layer arranged in a staggered form.

SUMMARY

An advantage of some aspects of the invention is to provide semiconductor devices capable of reducing the intrusion of light particularly from the lateral and diagonal directions, in which semiconductor devices the variation of characteristics is suppressed.

According to an aspect of the invention, a semiconductor device includes: a first light shielded region including a first semiconductor element, the first light shielded region being defined by a first light shielding wall provided in the periphery thereof; a second light shielded region including a second semiconductor element, the second light shielded region being defined by a second light shielding wall provided in the periphery thereof and being provided in a position adjacent to the first light shielded region; a first opening provided in the first light shielding wall; a second opening provided in the second light shielding wall and positioned facing to the first opening; a first wiring layer coupled with the first semiconductor element and brought out to the outside of the first light shielded region from the first opening; a second wiring layer coupled with the second semiconductor element and brought out to the outside of the second light shielded region from the second opening; and a light shielding film provided at least above a region sandwiched between the first light shielded region and the second light shielded region.

According to the semiconductor devices of the invention, the semiconductor devices having a further improved light shielding effect can be provided. Usually, semiconductor elements whose characteristics may vary with light have a light shielding structure in order to prevent light from being radiated, in which structure a light shielding film is provided above the semiconductor element, and a contact layer and a via layer are arranged in the periphery of the semiconductor element to thereby block off light from the lateral direction. However, wirings, signal lines, or the like are coupled with various kinds of semiconductor elements, and these wirings need to be brought out to the outside of the light shielding structure. In this case, although a region (an opening) having neither via layer nor contact layer provided in a part of the periphery of the semiconductor elements may be secured to bring out the wirings to the outside from this opening, light may intrude from this opening to thereby affect the characteristics of the semiconductor elements. However, according to the semiconductor devices of the invention, the respective openings (the first opening and the second opening) of the adjoining light shielded regions are provided in the positions that face to each other and the light shielding film is provided above the region sandwiched between the first opening and the second opening. For this reason, while reducing the area, which the light shielding film will require, to thereby provide the light shielding film efficiently, the intrusion of light from the opening can be suppressed. As a result, the semiconductor devices with reduced variations of the characteristics and with improved reliability can be provided.

The semiconductor device of the invention can further take the following embodiments.

A. In the semiconductor device of the invention, it is preferable that the light shielding film be further provided above the first light shielded region and the second light shielded region.

B. In the semiconductor device of the invention, it is preferable that the light shielding wall include: a groove-shaped opening portion provided in an interlayer insulating layer that is arranged in the periphery of the semiconductor element; and a contact layer or a via layer formed by burying an electric conductive layer in the opening portion.

C. In the semiconductor device of the invention, it is preferable that the first wiring layer comprise a plurality of wiring layers and the opening be provided in each wiring layer.

D. In the semiconductor device of the invention, it is preferable that the second wiring layer comprise a plurality of wiring layers and the opening be provided in each wiring layer.

According to these embodiments, an opening with a necessary minimum width just needs to be provided corresponding to each wiring layer, and therefore the intrusion of light can be reduced further.

E. In the semiconductor device of the invention, it is preferable that the first opening be provided in one side face of the first light shielded region.

F. In the semiconductor device of the invention, it is preferable that the second opening be provided in one side face of the second light shielded region.

According to this embodiment, even in the case where a plurality of openings exists, the positions thereof can be put together in one side face. For this reason, the area of the light shielding film that covers the upper portion of the openings can be reduced.

G. In the semiconductor device of the invention, it is preferable that the semiconductor element be a nonvolatile memory including a floating gate electrode.

According to this embodiment, the semiconductor device with the improved electric-charge retention characteristics can be provided.

H. In the semiconductor device of the invention, it is preferable that the nonvolatile memory be a nonvolatile memory of one layer gate type.

BRIEF DESCRIPTION OF THE DRAWINGS

The invention will be described with reference to the accompanying drawings, wherein like numbers refer to like elements.

DESCRIPTION OF EXEMPLARY EMBODIMENTS

Figure 1:
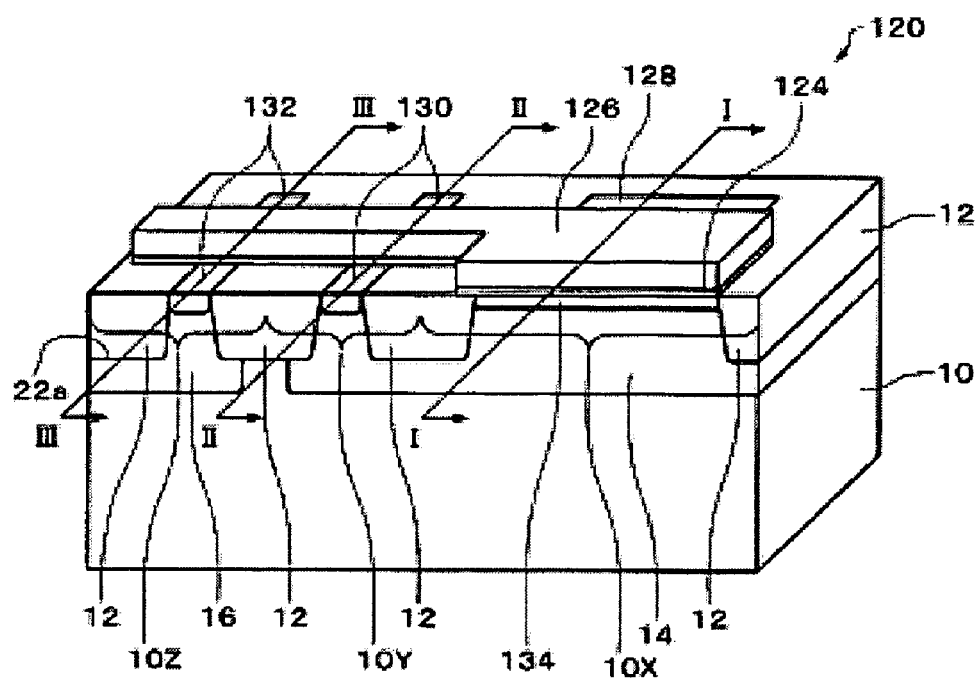
FIG. 1 is a perspective view schematically showing a structure of a nonvolatile memory provided in a semiconductor device concerning an embodiment.
Figure 2:
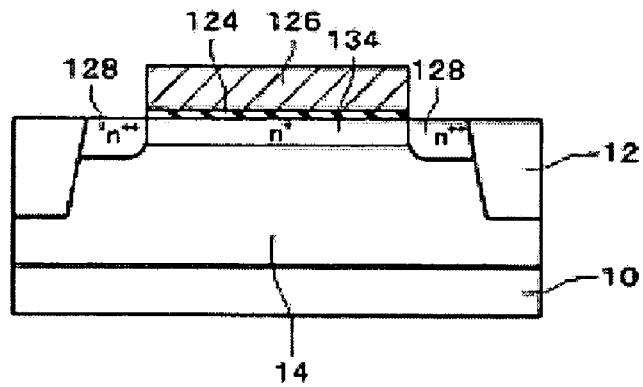
FIG. 2A is a sectional view along the I—I line of FIG. 1.
FIG. 2B is a sectional view along the II—II line of FIG. 1.
FIG. 2C is a sectional view along the III—III line of FIG. 1.
Figure 2:
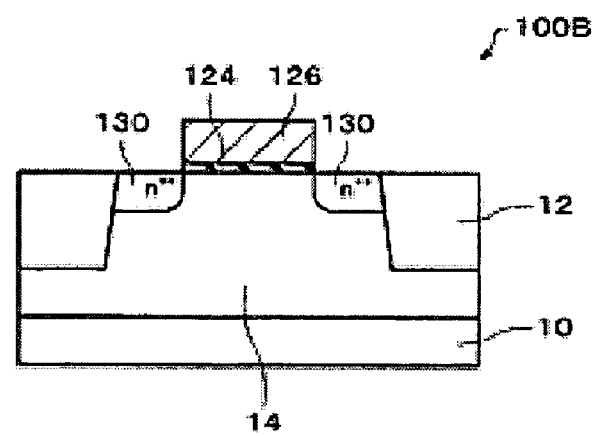
Figure 2:
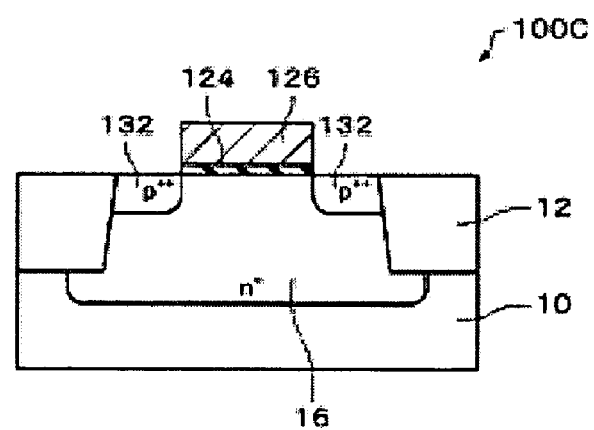
Figure 3:
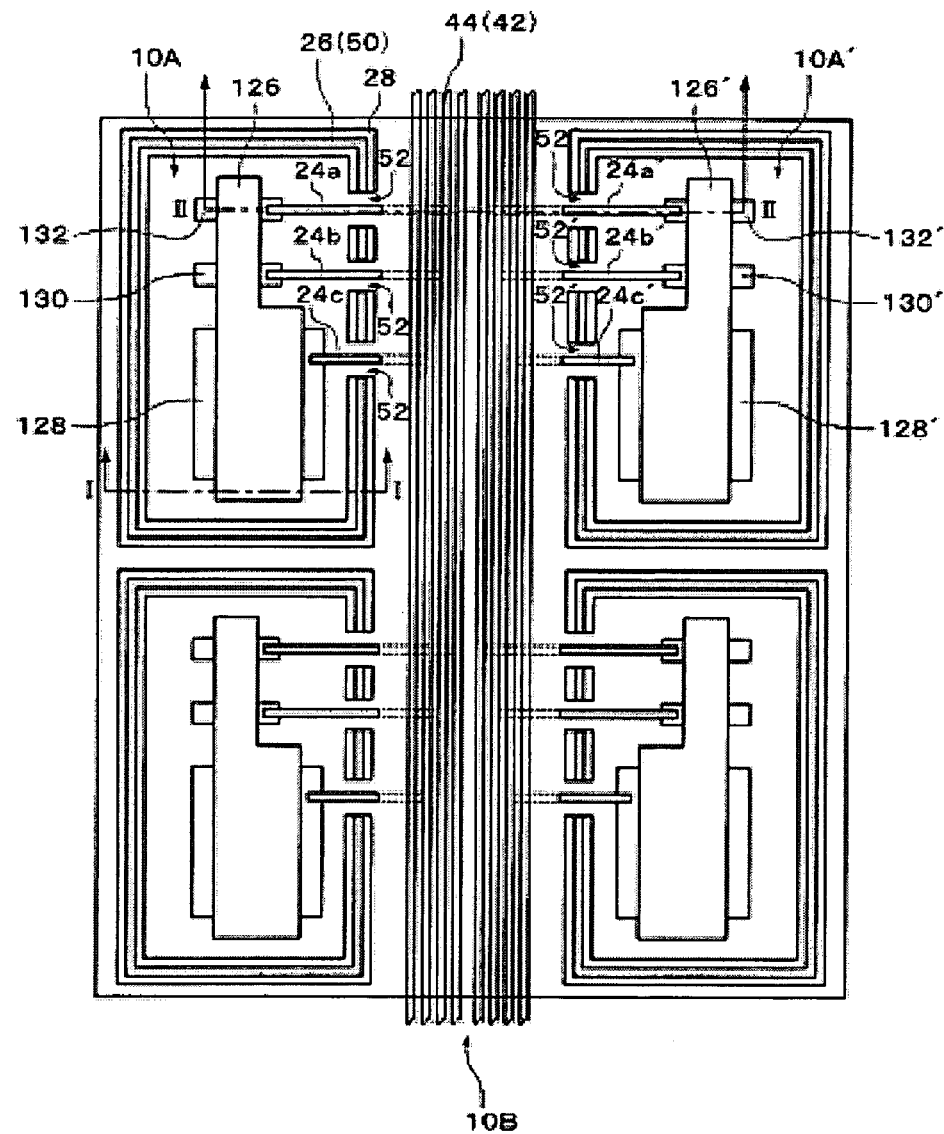
FIG. 3 is a plane view schematically showing the semiconductor device concerning the embodiment.
Figure 4:
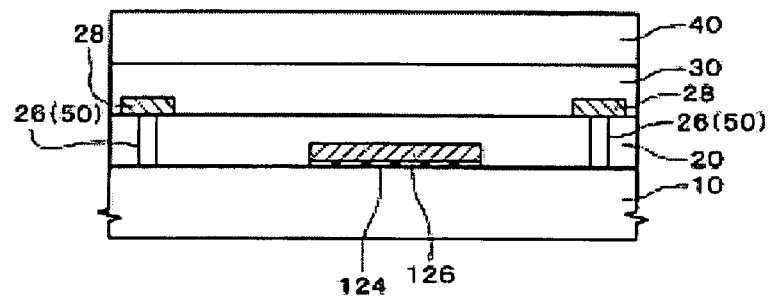
FIG. 4 is a sectional view along the I—I line of FIG. 3.
Figure 5:
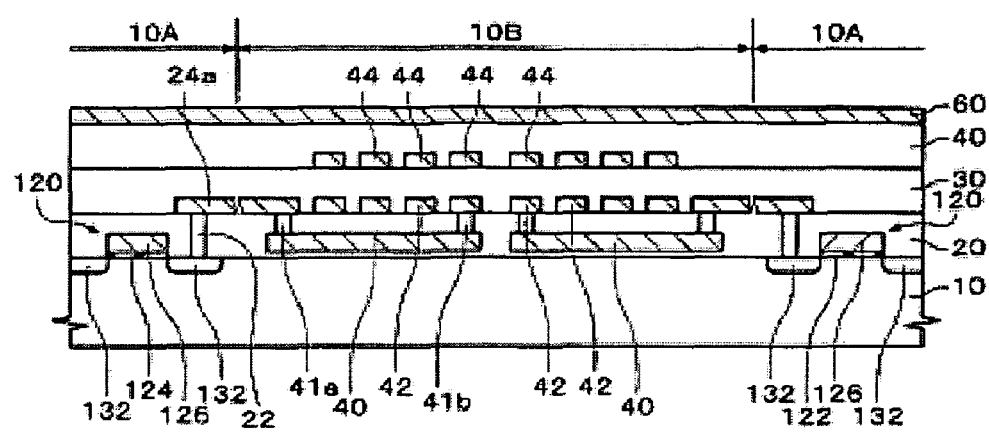
FIG. 5 is a sectional view along the II—II line of FIG. 3.

Next, an example of an embodiment of a semiconductor device of the invention will be described. The semiconductor device concerning the embodiment will be described with reference to FIG. 1 through FIG. 5. FIG. 1 is a perspective view schematically showing a nonvolatile memory cell (hereinafter, may be referred to as a "memory cell") provided in a light shielded region of the semiconductor device concerning the embodiment. FIG. 2A is a sectional view along the I—I line of FIG. 1, FIG. 2B is a sectional view along the II—II line of FIG. 1, and FIG. 2C is a sectional view along the III—III line of FIG. 1. FIG. 3 is a plane view schematically showing the semiconductor device concerning the embodiment. FIG. 4 is a sectional view along the I—I line of FIG. 3. FIG. 5 is a sectional view along the II—II line of FIG. 3.

In the following description, first, a memory cell 120 provided in a light shielded region 10A will be described, and a specific light shielding structure will be described thereafter.

In the memory cell 120 included in the semiconductor device of the embodiment, a control gate may be an N-type impurity region in a semiconductor layer 10, and a floating gate electrode may be formed of an electric conductive layer, such as one layer of poly silicon (hereinafter, may be referred to as a "nonvolatile memory device of one layer gate type").

As shown in FIG. 1, the memory cell 120 in the embodiment is provided in the P type semiconductor layer 10. The semiconductor layer 10 is separate—defined into a first region 10X, a second region 10Y, and a third region 10Z by an element insulating layer 12. The first region 10X and the second region 10Y are provided in a P-type well 14. The third region 10Z is provided in an N-type well 16. The first region 10X is a control gate portion, the second region 10Y is a writing portion, and the third region 1OZ is an erasing portion.

Above the semiconductor layer 10 in the first region 10X through the third region 10Z, an insulating layer 124 is provided. Above the insulating layer 124, a floating gate electrode 126 provided across the first through third regions 10X through 10Z is provided.

Next, the cross sectional structure of each region will be described. As shown in FIG. 2A, the first region 10X includes: an insulating layer 124 provided above the well 14; a floating gate electrode 126 provided above the insulating layer 124; an N-type impurity region 134 provided in the semiconductor 10 under the floating gate electrode 126; and an N-type impurity region 128 provided adjacent to the impurity region 134. The N-type impurity region 134 plays a role of the control gate, and the impurity region 128 is electrically coupled with a control gate line and serves as the contact portion for applying voltages to the control gate.

As shown in FIG. 2B, in the second region 10Y an N-channel type MOS transistor 100B is provided in order to write in the memory cell 120. The N-channel type transistor 100B includes: the insulating layer 124 provided above the well 14; the floating gate electrode 126 provided above the insulating layer 124; and an impurity region 130 provided in the semiconductor layer 10. The impurity region 130 becomes a source region or a drain region.

As shown in FIG. 2C, in the third region 10Z a P-channel type transistor 100C is provided. The P-channel type transistor 100C includes: the insulating layer 124 provided above the N type well 16; the floating gate electrode 126 provided above the insulating layer 124; and an impurity region 132 provided in the N type well 16. The impurity region 132 becomes a source region or a drain region.

Next, the semiconductor device concerning the embodiment will be described with reference to FIG. 3. In FIG. 3, an arrangement of the floating gate electrode 126 and the impurity regions 128, 130, and 132 among the components of the memory cell 120 are shown. Moreover, as required, the layers existing down below are shown by the dotted line, the layers existing thereabove by the solid line, and the numerals of the members existing down below will be shown in parenthesis.

As shown in FIG. 3, in the semiconductor device concerning the embodiment, the first light shielded region 10A and a second light shielded region 10A' are arranged adjacent to each other. The first light shielded region 10A is a region including the memory cell 120, the region being defined by a light shielding wall 50 provided in the periphery of the memory cell 120. Similarly, the second light shielded region 10A' is a region including a memory cell 120', the region being defined by a light shielding wall 50'. In the region sandwiched between the first light shielded region 10A and the second light shielded region 10A', various kinds of wirings to be coupled with a driver circuit are provided. In the following description the region sandwiched between the first light shielded region 10A and the second light shielded region 10A' will be described as being referred to as a wiring region 10B.

First, the first light shielded region 10A and the second light shielded region 10A' will be described. The structure of the memory cells 120 and 120' provided in each region is as described above. Next, the structure of light shielding walls 50 and 50' will be described with reference to FIG. 4. As shown in FIG. 4, above the semiconductor layer 10, the insulating layer 124 and the floating gate electrode 126 are provided sequentially, and the impurity region 134 is provided in the semiconductor layer 10. Above the memory cell 120, the interlayer insulating layers 20, 30, and 40 are provided sequentially. Above the interlayer insulating layer 20 and in the periphery of the memory cell 120, a first metal layer 28 is provided. The first metal layer 28 is coupled with the semiconductor layer 10 via a contact layer 26. This contact layer 26 will play a role of blocking off the intrusion of light into the memory cell 120 from the lateral direction and from the diagonally upper direction. In other words, in the semiconductor device of the embodiment the light shielding wall 50 is configured of this contact layer 26.

As shown in FIG. 3, although the light shielding walls 50 and 50' are provided in the periphery of the memory cells 120 and 120', they do not necessarily cover the periphery completely. Specifically, partially there are places, in which the first metal layer 28 and the contact layer 26 are not provided, in the periphery of the memory cells 120 and 120', and these portions become openings 52 and 52'.

The opening 52 of the first light shielded region 10A and the opening 52' of the second light shielded region 10A' are provided in the positions facing to each other. In other words, a side face in which the opening 52 of the first light shielded region 10A is provided and a side face in which the opening 52' is provided in the second light shielded region 10A' face to each other. Moreover, although a plurality of signal lines 24a, 24b, and 24c are brought out from the first light shielded region 10A, these plurality of signal lines 24a, 24b, and 24c are brought out to the same direction. The same direction means that they are brought out from the opening 52 provided in one side face among the side faces of the light shielded region 10A. Similarly, also from the second light shielded region 10A', a plurality of signal lines 24a', 24b', and 24c' are brought out from the opening 52' provided in one side face of the second light shielded region 10A'.

At this time, since the opening 52 and opening 52' are provided as to face to each other, the plurality of wiring layers brought out from the respective light shielded regions 10A and 10A' will be put together to be arranged in the wiring region 10B.

In FIG. 3, there is an opening for each of the signal lines 24a, 24b and 24c, but not limited thereto, and an embodiment, in which one large opening 52 is provided and from this opening 52 all the three signal lines are brought out, can be also taken.

Above the first light shielded region 10A, the wiring region 10B, and the second light shielded region 10A', a light shielding film 60 is provided as to cover the whole surface thereof. It is preferable that the light shielding film 60 be one continuous film.

Next, with reference to FIG. 5, the cross sectional structure will be described paying attention to the portion from which the signal lines are brought out. As described above, the semiconductor device of the embodiment includes the first light shielded region 10A, the second light shielded region 10A', and the wiring region 10B provided as to be sandwiched therebetween. In the first light shielded region 10A and the second light shielded region 10A', the memory cell 120 is provided in the semiconductor layer 10. In the first light shielded region 10A and the second light shielded region 10A', the interlayer insulating layer 20 is provided above the memory cell 120. A first metal layer 24a is provided above the interlayer insulating layer 20. The first metal layer 24a is the signal line for the memory cell 120 and electrically coupled via the impurity region 132 of the memory cell 120 and the contact layer 22.

In the wiring region 10B, a wiring layer 40 formed in the same step as the step of forming the floating gate electrode 126, and respective wiring layers 42 and 44 above the interlayer insulating layers 20 and 30 are provided. The wiring layers 40, 42, and 44 are coupled with the memory cell 120 and become the wirings to be coupled with a control circuit (not shown) of a memory cell array. As shown in FIG. 5, in the semiconductor device of the embodiment, the signal line 24a is brought out to the wiring region 10B and coupled with the wiring layer 40 through a via layer 41a. The wiring layer 40 is coupled with the wiring layer 42 through a via layer 41b, and this wiring layer 42 will be eventually coupled with the control circuit.

According to the semiconductor device of the invention, the semiconductor device having a further improved light shielding effect can be provided. Usually, in the nonvolatile memory having a floating gate electrode, there is a problem of inviting the deterioration of electric-charge retention characteristics, such as the electric charges injected into the floating gate electrode 126 escape therefrom by receiving light. For this reason, in order to prevent the memory cell 120 from receiving light, the memory cell 120 has a light shielding structure, in which a light shielding film is provided above the memory cell 120, and a contact layer and a via layer are arranged in the periphery of the memory cell 120, thereby blocking off light from the lateral direction. However, various kinds of signal lines need to be coupled with the memory cell, and these signal lines need to be brought out to the outside of the light shielding structure. In this case, although a region (an opening), in which neither via layer nor contact layer is provided, may be secured in a part of the periphery of the semiconductor element to thereby bring out the wirings to the outside from this opening, light may intrude from this opening, thereby affecting the electric-charge retention characteristics. However, according to the semiconductor device of the invention, the respective openings (the first opening 52 and the second opening 52') of the adjoining first light shielded region 10A and second light shielded region 10A' are provided in the positions facing to each other, and the light shielding film 60 is provided above the region (the wiring region 10B) sandwiched between the first opening 52 and the second opening 52'. For this reason, while reducing the area, which the light shielding film 60 will require, to thereby provide the light shielding film 60 efficiently, the intrusion of light from the openings 52 and 52' can be suppressed. As a result, the semiconductor device with reduced variations of the characteristics and improved reliability can be provided.

Moreover, while in the semiconductor device of the embodiment three signal lines 24a, 24b, and 24c are brought out to the outside of the light shielded region 10A, the opening 52 is provided for each of the signal lines 24a, 24b, and 24c. For this reason, it is possible to reduce the gap, into which light may intrude, as small as possible, and the reduction of the intrusion of light can be attained. As a result, it is possible to contribute to improvement of the reliability.

In addition, the invention can be modified suitably within the spirit and scope of the invention, without being restricted to the above-described embodiments. For example, in the embodiments, there has been shown the case where one memory cell 120 and one memory cell 120' are provided in the first light shielded region 10A and the second light shielded region 10A', respectively, but not limited thereto. In the light shielded regions 10A and 10A' a plurality of memory cells 120 may be provided, and except the memory cell 120, other devices, such as selector transistors may be included. Moreover, there has been shown the case where the opening 52 is provided in each of the signal lines 24a, 24b, and 24c, but not limited thereto. For example, the signal lines 24a, 24b, and 24c may be brought out from one large opening 52. In this case, it is not necessary to finely provide a plurality of openings 52, and there is an advantage that the pattern of the light shielding wall 50 can be made a simple one.

What is claimed is:

1. A semiconductor device comprising:
   a first light shielded region including a first semiconductor element, the first light shielded region being defined by a first light shielding wall provided in the periphery thereof;
   a second light shielded region including a second semiconductor element, the second light shielded region being defined by a second light shielding wall provided in the periphery thereof and being provided in a position adjacent to the first light shielded region;
   a first opening provided in the first light shielding wall;
   a second opening provided in the second light shielding wall and positioned facing to the first opening;
   a first wiring layer coupled with the first semiconductor element and brought out to the outside of the first light shielded region from the first opening;
   a second wiring layer coupled with the second semiconductor element and brought out to the outside of the second light shielded region from the second opening; and
   a light shielding film provided at least above a region sandwiched between the first light shielded region and the second light shielded region.

2. The semiconductor device according to claim 1, wherein the light shielding film is further provided above the first light shielded region and the second light shielded region.

3. The semiconductor device according to claim 1, wherein the light shielding wall includes: a groove-shaped opening portion provided in an interlayer insulating layer that is arranged in the periphery of the semiconductor element; and a contact layer or a via layer formed by burying an electric conductive layer in the opening portion.

4. The semiconductor device according to claim 1, wherein the first wiring layer comprises a plurality of wiring layers and the opening is provided in each wiring layer.

5. The semiconductor device according to claim 1, wherein the second wiring layer comprises a plurality of wiring layers and the opening is provided in each wiring layer.

6. The semiconductor device according to claim 1, wherein the first opening is provided in one side face of the first light shielded region.

7. The semiconductor device according to claim 1, wherein the second opening is provided in one side face of the second light shielded region.

8. The semiconductor device according to claim 1, wherein the semiconductor element is a nonvolatile memory including a floating gate electrode.

9. The semiconductor device according to claim 8, wherein the nonvolatile memory is a nonvolatile memory of one layer gate type.

* * * * *